United States Patent [19]
Akimoto

[11] Patent Number: 6,097,005
[45] Date of Patent: Aug. 1, 2000

[54] SUBSTRATE PROCESSING APPARATUS AND SUBSTRATE PROCESSING METHOD

[75] Inventor: Masami Akimoto, Kumamoto, Japan

[73] Assignee: Tokyo Electron Limited

[21] Appl. No.: 09/376,984

[22] Filed: Aug. 19, 1999

[30] Foreign Application Priority Data

Aug. 20, 1998 [JP] Japan .................................. 10-250478

[51] Int. Cl.[7] .............................. H05B 3/68; C23C 16/00
[52] U.S. Cl. ........................................ 219/444.1; 118/724
[58] Field of Search ............................. 219/443.1, 444.1, 219/445.1, 446.1, 448.1; 118/715, 716, 723 VE, 724, 725

[56] References Cited

U.S. PATENT DOCUMENTS

| | | | |
|---|---|---|---|
| 4,771,730 | 9/1988 | Tezuka | 118/724 |
| 5,151,871 | 9/1992 | Matsumura et al. | 219/444.1 |
| 5,581,874 | 12/1996 | Aoki et al. | 29/825 |
| 5,817,156 | 10/1998 | Tateyama et al. | 118/725 |
| 5,835,334 | 11/1998 | McMillin et al. | 361/234 |
| 5,974,682 | 11/1999 | Akimoto | 118/724 |

FOREIGN PATENT DOCUMENTS 3-69111  3/1991  Japan.
7-201719  8/1995  Japan.

Primary Examiner—Sam Paik
Attorney, Agent, or Firm—Rader, Fishman & Grauer

[57] ABSTRACT

An apparatus includes a mounting table which is a main temperature controlling plate (a main cooling plate), a cooling section for maintaining the mounting table, for example, at 23° C., a holding pin for holding a wafer while lifting it slightly off the mounting table, a mechanism for raising and lowering the pin, an auxiliary cooling plate as an auxiliary temperature controlling plate for cooling the wafer from the opposite side to the mounting table, and raising and lowering means for raising and lowering the auxiliary cooling plate to thereby move it close to and away from the wafer. The auxiliary cooling plate is maintained at a lower temperature than the main cooling plate. The wafer starts to be cooled by the main cooling plate and the auxiliary cooling plate, the auxiliary cooling plate is then moved away from the wafer at a temperature slightly higher than 23° C., for example, at 30° C., and thereafter the wafer is cooled only by the main cooling plate. Thus, the cooling of the wafer can be performed with high efficiency.

26 Claims, 10 Drawing Sheets

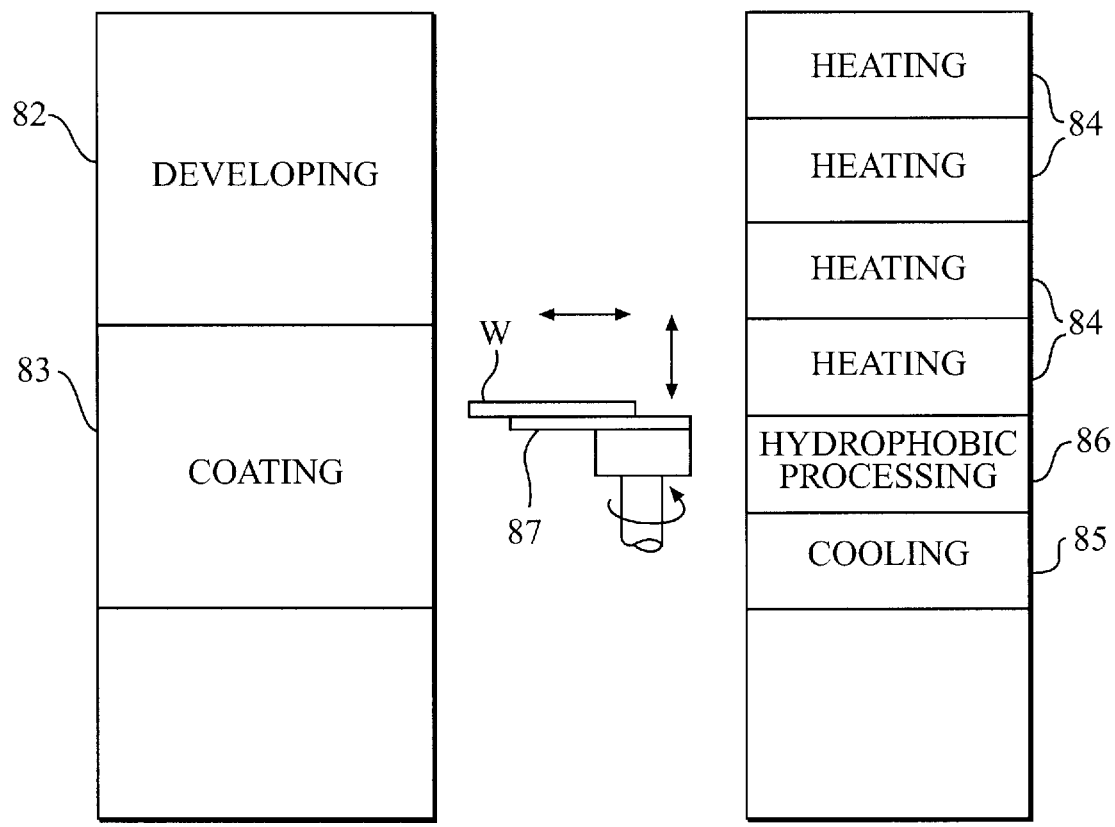
F I G . 9

SUBSTRATE PROCESSING APPARATUS AND SUBSTRATE PROCESSING METHOD

BACKGROUND OF THE INVENTION

1. Field of the Invention

The present invention relates to a substrate processing apparatus and a substrate processing method.

2. Description of the Related Art

Conventionally, a mask to form a desired pattern on the front surface of a semiconductor wafer (referred to as a wafer hereinafter) or a glass substrate for a liquid crystal display (an LCD substrate) is obtained by coating the front face of a substrate such as a wafer which has undergone hydrophobic processing with a resist, and thereafter applying light rays, electron rays, or ionic rays to the resist-coated face, then exposing and developing the face.

The hydrophobic processing of a wafer is performed while the wafer is heated, for example, to 80° C. Therefore it is necessary that the wafer be cooled by a cooling apparatus before being coated with resist. In addition, baking processing follows exposure. In the backing processing, the wafer is heated to 120° C., which requires that the wafer be cooled, for example, to 23° C. by the cooling apparatus before being developed.

The cooling apparatus consists of a mounting table on which a wafer is mounted, a cooling section for maintaining the mounting table at 23° C., three ascendable and descendable holding pins, and raising and lowering means for the holding pins, and cools the wafer while the wafer is lifted slightly off the mounting table by the holding pins.

SUMMARY OF THE INVENTION

In the aforesaid conventional cooling apparatus, however, a wafer is cooled from a face opposite a cooling face (the upper face) of a mounting table, that is, the rear face of the wafer, and the front face side of the wafer is of an open system, thus causing disadvantages that cooling efficiency is low and it takes a long time to cool the wafer from 120° C. to 23° C. whereby throughput is low.

Accordingly, it is intended that the throughput is improved by preparing two or more cooling apparatus, using them in parallel, and staggering the timing to carry in and out wafers for respective cooling apparatus, thereby quickening the timing to carry in and out the wafers for the whole cooling apparatus group. However, the number of cooling apparatus increases, which causes the disadvantage of increasing an installation space in addition to increasing costs.

An object of the present invention is to provide a substrate processing apparatus and a substrate processing method capable of raising temperature controlling efficiency and controlling the temperature of a substrate in a shorter period of time.

To eliminate the above disadvantages, a first aspect of the present invention includes a first cooling plate being set at a first temperature and having a first face on which a substrate is mounted, a second cooling plate being set at a second temperature and having a second face opposite the first face, and means for adjusting a space between the first face and the second face by moving at least either the first cooling plate or the second cooling plate.

A second aspect of the present invention includes a first heating plate being set at a first temperature and having a first face on which a substrate is mounted, a second heating plate being set at a second temperature and having a second face opposite the first face, and means for adjusting a space between the first face and the second face by moving at least either the first heating plate or the second heating plate.

A third aspect of the present invention includes the steps of (a) mounting a substrate on a main temperature controlling plate, (b) moving an auxiliary temperature controlling plate, which is set at a temperature different from that of the main temperature controlling plate, close to the substrate from the opposite side to the main temperature controlling plate, and (c) moving the auxiliary temperature controlling plate away from the substrate when the temperature of the substrate reaches a predetermined temperature range.

According to the present invention, for example, the temperature of the substrate is controlled while the substrate is placed between the main temperature controlling plate and the auxiliary temperature controlling plate. Hence, as compared with conventional apparatus in which an auxiliary temperature controlling plate is not provided, temperature controlling efficiency is improved, thereby allowing the substrate to be controlled to a predetermined temperature in a shorter period of time. When the temperature of the substrate is controlled, for example, the auxiliary temperature controlling plate moves away from a cooling position at a temperature somewhat higher than a target temperature, and subsequently the substrate is cooled only by the main temperature controlling plate, thus precisely cooling the substrate to the target temperature.

These objects and still other objects and advantages of the present invention will become apparent upon reading the following specification when taken in conjunction with the accompanying drawings.

BRIEF DESCRIPTION OF THE DRAWINGS

FIG. 9 is a schematic view showing the coating and developing system in side view;

DETAILED DESCRIPTION OF THE PREFERRED EMBODIMENT

Figure 1:
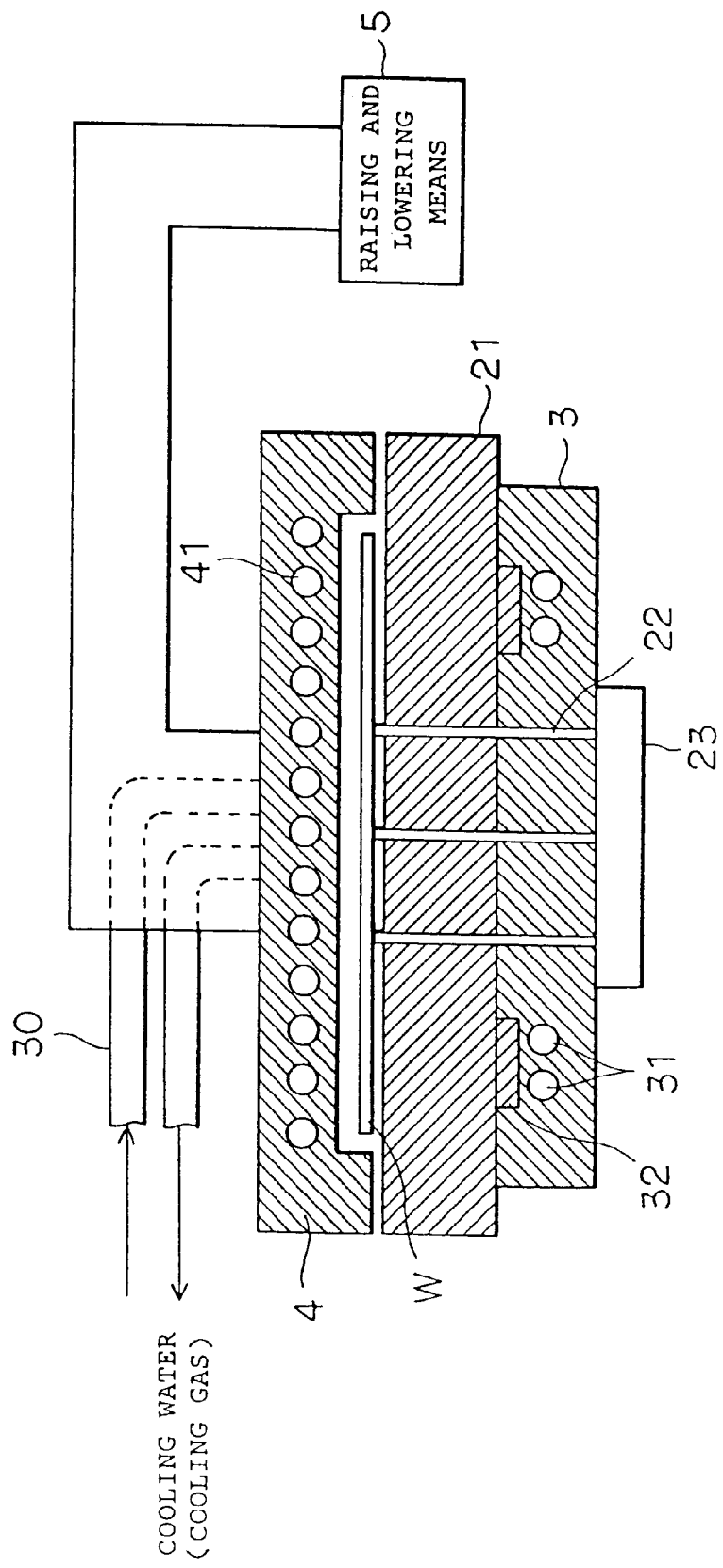
FIG. 1 is a diagrammatic view showing an embodiment in which a substrate temperature controller according to the present invention is applied to a cooling apparatus.

FIG. 1 is a diagrammatic view showing a cooling apparatus according to an embodiment of the present invention. The cooling apparatus includes a mounting table 21 on which a wafer W is mounted, a cooling section 3 for maintaining the mounting table 21 at a predetermined temperature which is not specially limited, for example, at 23° C., three, for example, of ascendable and descendable holding pins 22 composing holding members incorporated in the mounting table 21 for holding the wafer W while lifting it slightly off the mounting table 21, a raising and lowering mechanism 23 for raising and lowering the pins, an auxiliary cooling plate 4 for cooling the wafer W from the opposite side to the mounting table 21, that is, from the wafer front face side, and raising and lowering means 5 as space adjusting means composed of a motor and the like for raising and lowering the auxiliary cooling plate 4 to thereby move it close to and away from the wafer W.

The wafer W is cooled, for example, 0.05 mm to 0.1 mm away from a cooling face of the mounting table 21, and, for example, 0.1 mm to 0.5 mm away from a cooling face of the auxiliary cooling plate 4 by the holding pins 22, and the temperature thereof is controlled at, for example, 23° C.±0.3° C.

Figure 2:
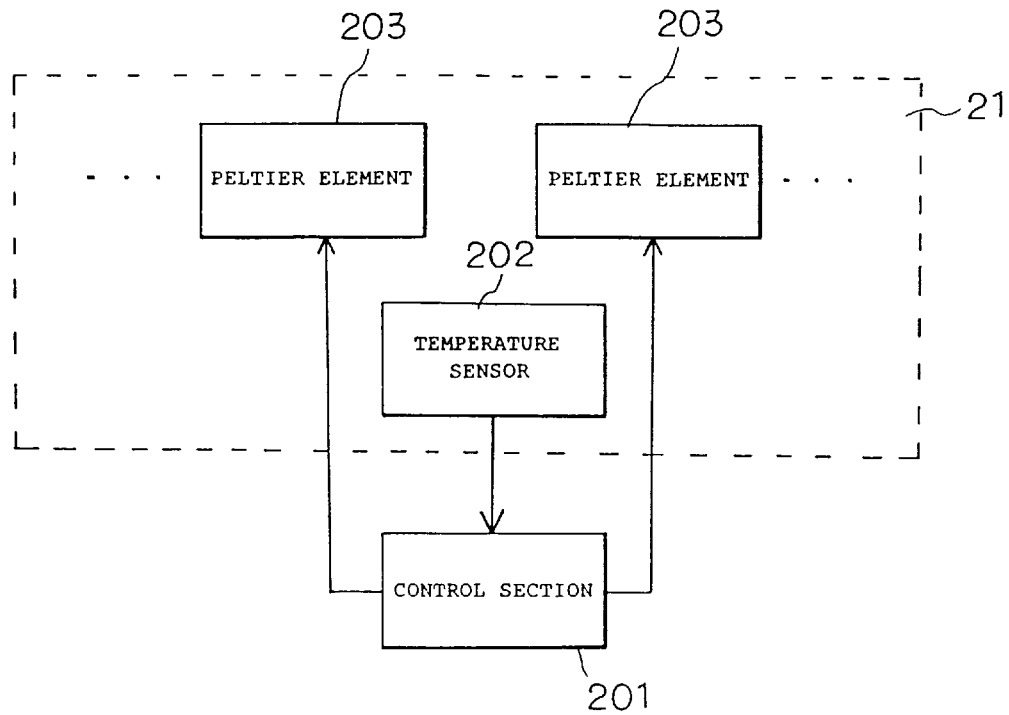
FIG. 2 is a block diagram showing the configuration of a temperature control system of a mounting table in the cooling apparatus shown in FIG. 1.

The mounting table 21 and the cooling section 3 compose a main temperature controlling plate. Cooling pipes 31 are provided inside the cooling section 3, and cooling water or cooling gas the temperature of which is lower than 23° C., for example, flows through the cooling pipes 31. Also inside the cooling section 3, heating means 32, for example, composed of Peltier elements and a resistance heating wire is provided. A cooling face (the upper face) of the mounting table 21 is maintained, for instance, at 23° C. by cooling by the cooling water and heating by the Peltier elements and the like. As shown in FIG. 2, a temperature sensor 202 detects the temperature of the mounting table 21, and a control section 201 turns on/off Peltier elements 203 and the like based on the detected value.

Cooling pipes 41 are provided inside the auxiliary cooling plate 4, and cooling water or cooling gas the temperature of which is lower than 23° C., for example, flows through the cooling pipes 41. Thus, a cooling face opposite the wafer W of the auxiliary cooling plate 4 is maintained, for instance, at a temperature lower than 23° C. A refrigerant such as cooling water or cooling gas flows and circulates through a refrigerant channel 30 connected to the cooling pipes 31 and 41.

Figure 3:
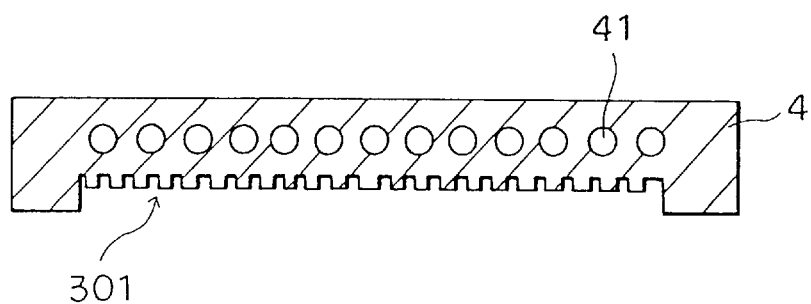
FIG. 3 is a sectional view showing a modified example of an auxiliary cooling plate in the cooling apparatus shown in FIG. 1.

Although not specially limited, the auxiliary cooling plate 4, for example, is made of aluminum or copper with excellent thermal conductivity. The cooling face of the auxiliary cooling plate 4 is, for example, black. As shown in FIG. 3, protruding and recessed portions 301 may be formed in the cooling face of the auxiliary cooling plate 4. If the cooling face is black or has protruding and recessed portions as described above, heat absorbency is improved, thus enhancing cooling efficiency.

Figure 4A:
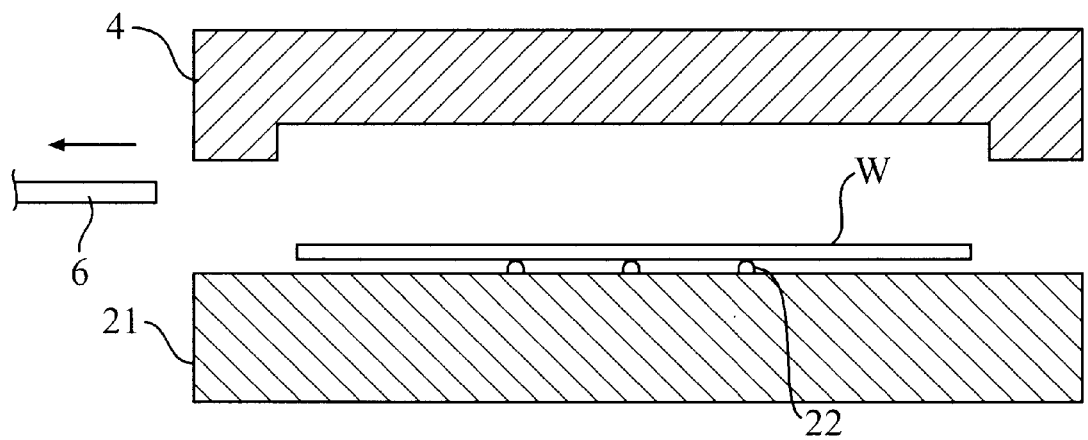
FIG. 4(a), FIG. 4(b), and FIG. 4(c) are schematic views for explaining the operation of the cooling apparatus shown in FIG. 1.

Next, the operation of the aforesaid embodiment will be explained with reference to FIG. 4 and FIG. 5. The wafer W which has completed hydrophobic processing and baking processing after exposure is brought into the cooling apparatus by means of a transfer arm 6, and mounted on the mounting table 21 by the cooperation of the holing pins 22 and the transfer arm 6 (See FIG. 4(a)). At this time, the auxiliary cooling plate 4 is raised to a position at which it does not disturb the entrance of the wafer W. The mounting table 21 is maintained at 23° C., for example, whereas the auxiliary cooling plate 4 is maintained at a temperature lower than that of the mounting table 21.

Figure 4B:
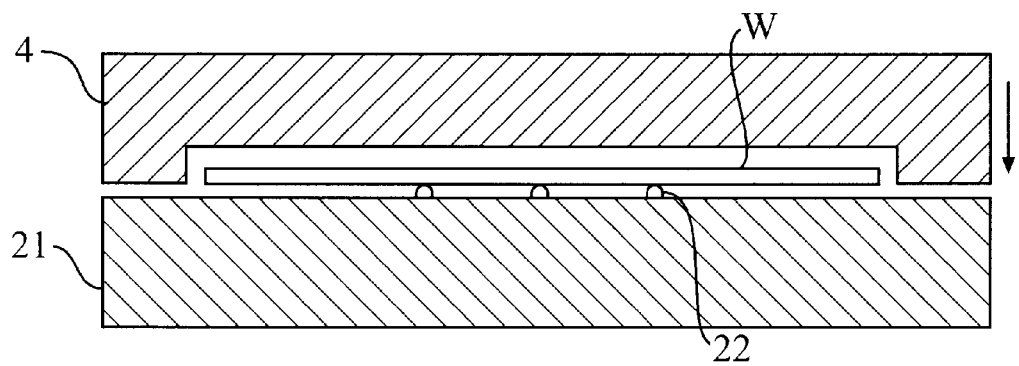
Figure 4C:
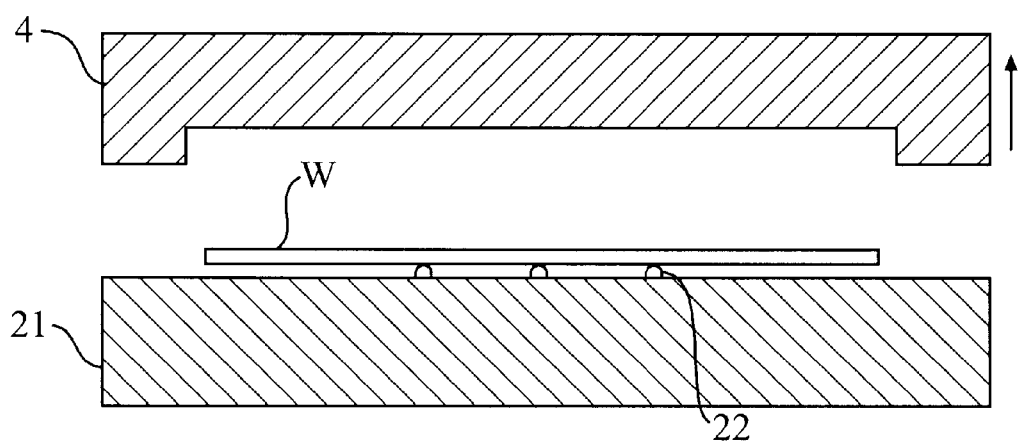
Figure 5:
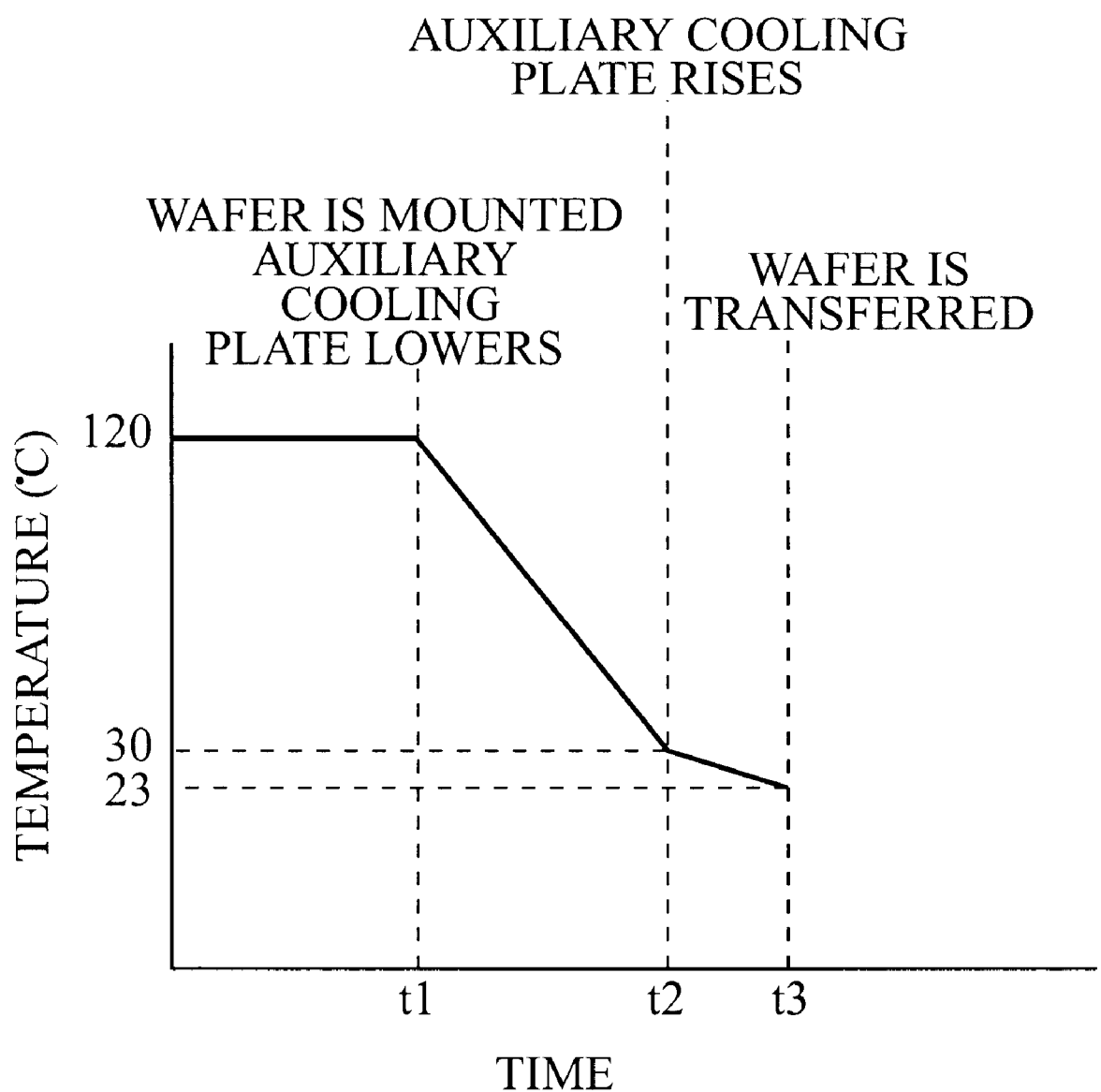
FIG. 5 is a graph showing a temperature profile in cooling by the cooling apparatus.

When the wafer W is mounted, the auxiliary cooling plate 4 lowers (See FIG. 4(b)). In a situation after baking processing, for example, the temperature of the wafer W maintained at 120° C. starts to fall (a point in time t1 in FIG. 5). When the temperature of the wafer W reaches a temperature a little higher than a target temperature (23° C., for instance), for example, 30° C. (a point in time t2 in FIG. 5) although not specially limited, the auxiliary cooling plate 4 rises (See FIG. 4(c)).

In the above case, it is possible that the temperature of the wafer W is actually detected by the temperature sensor 202 provided at the forward end portion of the holding pin 22, measured by a radiation thermometer, or the like, and that the rising timing of the auxiliary cooling plate 4 is set at a point in time when the detected temperature or measured temperature reaches, for example, 30° C. Alternatively, it is also possible that an elapsed period of time from a point of time when the cooling of the wafer W is started (the point in time t1 in FIG. 5) is measured by a timer or the like, and that the auxiliary cooling plate 4 is raised at a point in time when a period of time taken from the point in time t1 to the point in time t2, that is, a period of time corresponding to a period of time (t2−t1) elapses. This is because a temperature profile in cooling is almost constant unless ambient temperature, the temperature of the heated wafer W or the like is changed, since the temperature environment of the cooling apparatus is almost constant. In this case, it is necessary to previously obtain the period of time (t2−t1) by experiments and the like.

After the auxiliary cooling plate 4 moves away from the wafer W, the wafer W is cooled only by the mounting table 21 which is a main cooling plate, and the temperature thereof gradually reaches the target temperature, for example, 23° C. (a point in time t3 in FIG. 5). Then, the wafer W is carried out of the cooling apparatus by the transfer arm 6.

The auxiliary cooling plate 4 moves away at a temperature somewhat higher than the target temperature as described above, thereby precisely cooling the wafer W to the target temperature. Specifically, since the temperature of the cooling face of the auxiliary cooling plate 4 is lower than the target temperature (23° C.), if the auxiliary cooling plate 4 is moved away after the wafer W is cooled to the target temperature (23° C.) with the auxiliary cooling plate 4 being kept close to the wafer W, the temperature of the wafer W comes to be beyond the allowable error range of the target temperature (23° C.±0.3° C.).

According to the aforesaid embodiment, the wafer W heated in the hydrophobic processing or the baking processing after exposure is cooled while placed between the mounting table 21 as the main temperature controlling plate and the auxiliary cooling plate 4. Thus, as compared with conventional apparatus in which a wafer is cooled only by a mounting table, cooling efficiency is improved, whereby the wafer W can be cooled to a predetermined temperature in a shorter period of time. The auxiliary cooling plate 4 moves away from the wafer W at a temperature slightly higher than the target temperature, and subsequently the wafer W is cooled only by the cooling plate 21, thereby precisely cooling the wafer W to the target temperature.

Figure 6:
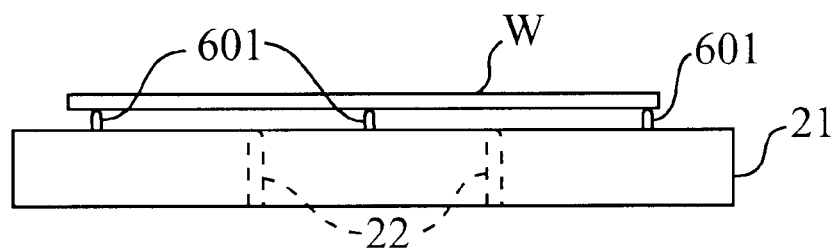
FIG. 6 is a diagrammatic view showing another example of the cooling apparatus according to the present invention.

It should be noted that the wafer W may be mounted directly on the mounting table 21 without providing the holding pins 22, which is not specially shown, though, in which case the same effects as those in the aforesaid embodiment can be obtained. Further, as shown in FIG. 6, proximity pins 601 for holding a substrate above the mounting table 21 while lifting it off a first face thereof may be provided in addition to the holding pins 22, in which case the same effects as those in the aforesaid embodiment can be obtained.

Figure 7:
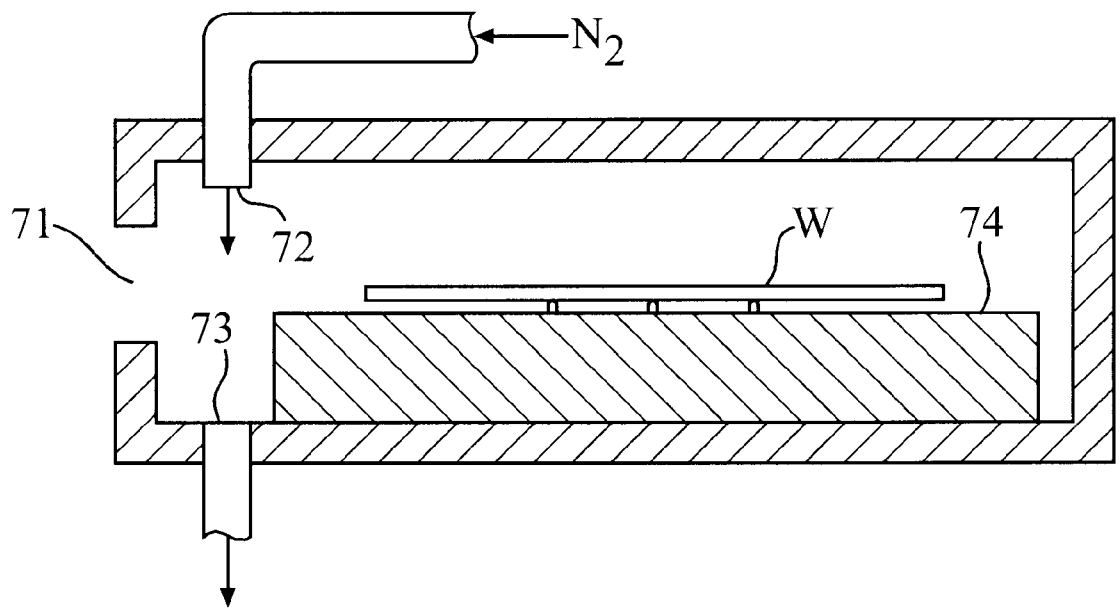
FIG. 7 is a diagrammatic view showing still another example of the cooling apparatus according to the present invention.

The temperature of the cooling face of the auxiliary cooling plate 4 may be set to be higher than that of the cooling face of the main cooling plate (the mounting table 21). Moreover, it is possible to provide an outlet port 72 and an inlet port 73 for cooling gas in the vicinity of the transfer port 71 of the cooling apparatus instead of providing an auxiliary cooling plate as shown in FIG. 7, and to previously cool the wafer W by blowing cooling gas such as N2 or the like against the wafer W when the wafer W is carried in through the transfer port 71 by means of a transfer arm not shown and mounted on a mounting table 74 which is cooled to the target temperature.

Furthermore, when the auxiliary cooling plate 4 is moved away from the mounting table 21 which is the main temperature controlling plate, the space between the mounting table 21 and the auxiliary cooling plate 4 may be enlarged stepwise by raising the auxiliary cooling plate 4 stepwise, thus making it possible to cool the wafer W more precisely and in a shorter period of time. Even if the rising speed of the auxiliary cooling plate 4 is gradually increased while the auxiliary cooling plate 4 is moved away from the mounting table 21 as the main temperature controlling plate, the same effects can be obtained.

Figure 8:
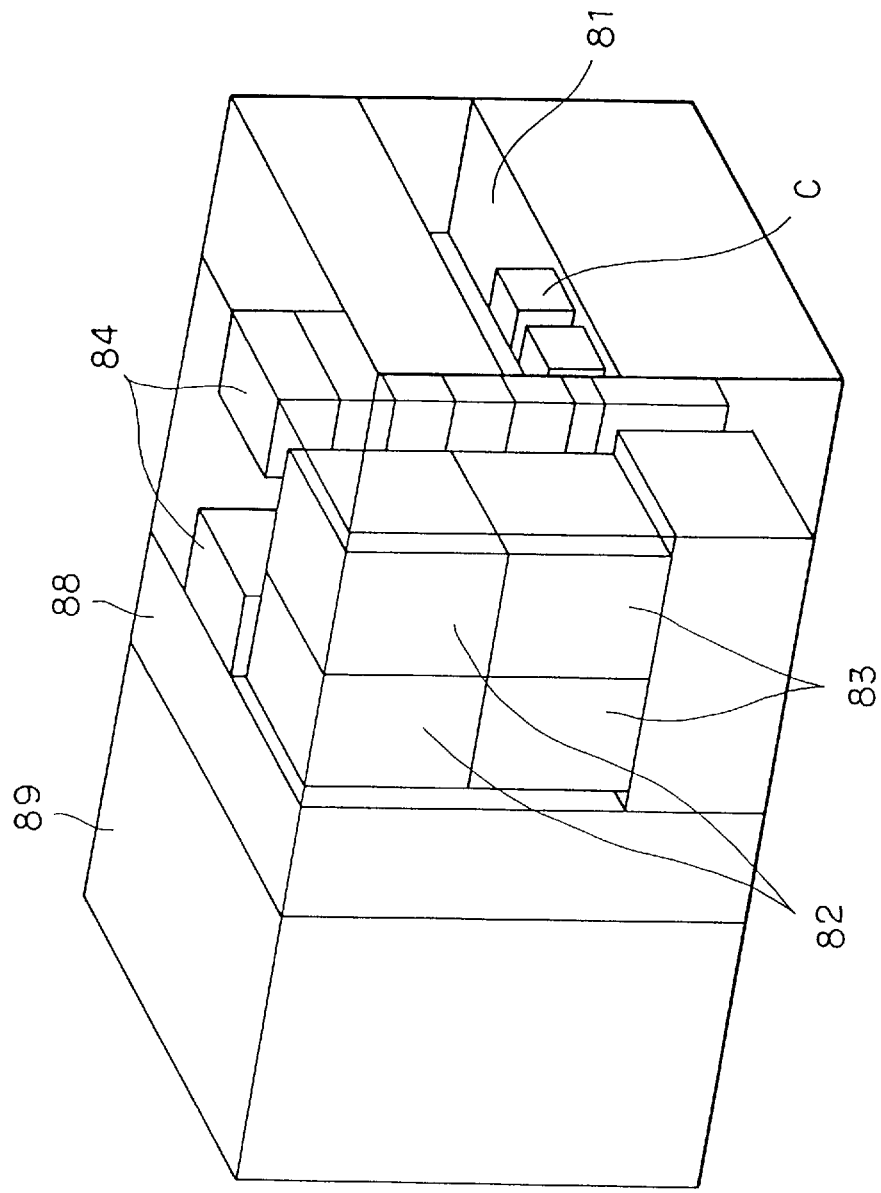
FIG. 8 is a diagrammatic perspective view showing a coating and developing system in which the cooling apparatus according to the present invention is used.

An outline of an example of a coating and developing system incorporating the cooling apparatus according to the present invention is explained with reference to FIG. 8 and FIG. 9. In FIG. 8, a symbol 81 represents a cassette transfer stage for carrying a wafer cassette in and out, on which a cassette C housing, for example, 25 wafers is mounted by an automatic transfer robot, for instance. When the inner part is seen from the transfer stage 81, for example, at the back side of the transfer stage 81, coating and developing system units are arranged on the left side, and heating, cooling and hydrophobic processing system units are arranged on the right side.

In the coating and developing system units, for instance, two developing units 82 are provided at the upper stage, and two coating units 83 at the lower stage. In the heating, cooling, and hydrophobic system units, heating units 84, a cooling unit 85, and a hydrophobic processing unit 86 are vertically provided.

A wafer transfer arm 87 is provided between the coating and developing system units and the heating, cooling, and hydrophobic processing system units. The wafer transfer arm 87 is formed to be ascendable and descendable, movable right and left, and back and forth, and rotatable around a vertical shaft, and delivers the wafer W between the coating and developing system units, the heating, cooling, and hydrophobic processing system units, the transfer stage 81, and an interface unit 88 which is described later.

If the aforesaid section including the coating and developing system units and the heating, cooling, and hydrophobic processing system units is called a clean track, the interface unit 88 is arranged between the clean track and an aligner 89 and delivers the wafer between them by means of a transfer system not shown.

Figure 10:
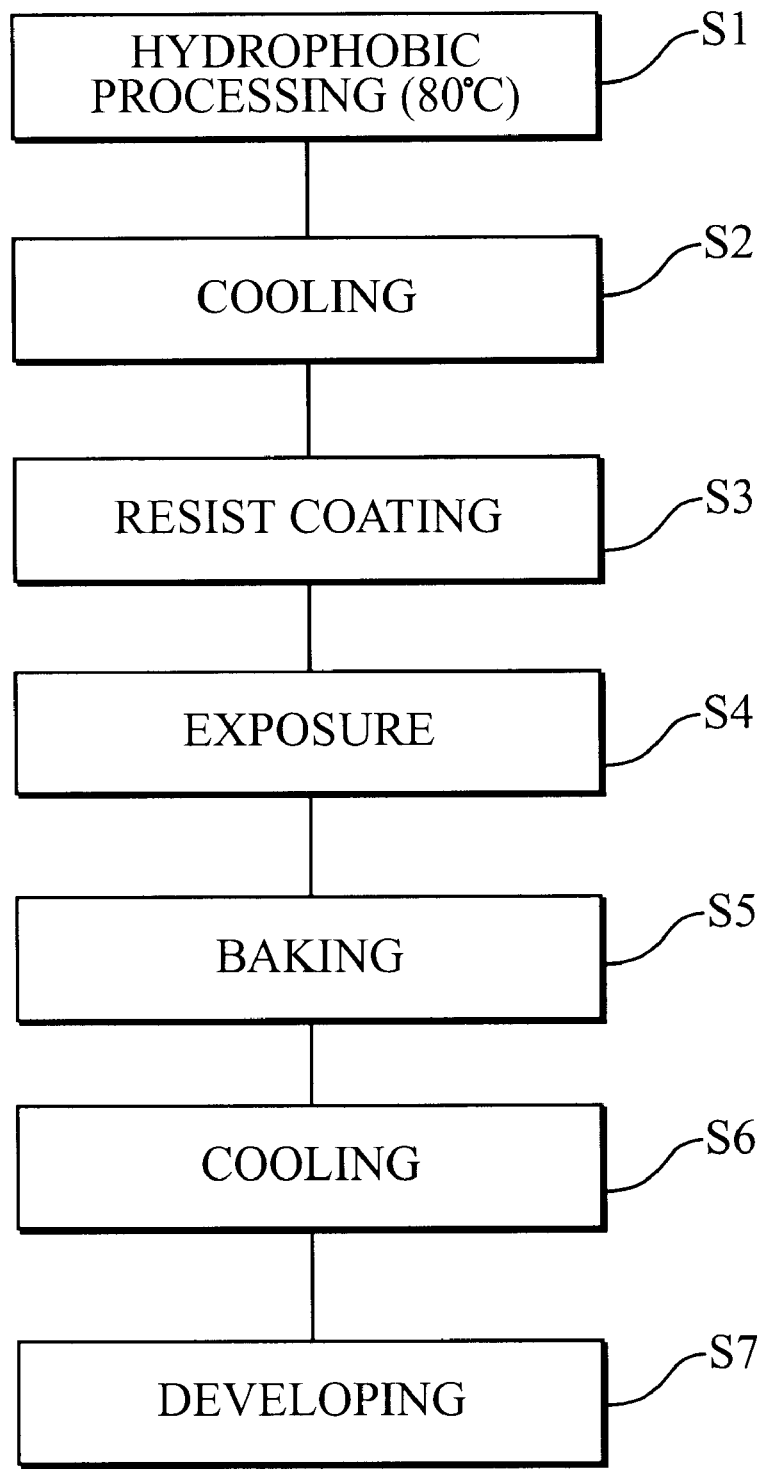
FIG. 10 is a flowchart showing a processing process in the coating and developing system.

The flow of the wafer in the coating and developing system will be explained with reference to FIG. 10. First, the wafer cassette C housing the wafer W is brought into the transfer stage 81 from the outside. The wafer W is then taken out of the cassette C by the wafer transfer arm 87 and undergoes hydrophobic processing, for example, at 80° C. in the hydrophobic processing unit 86 (step S1). Thereafter, the wafer W is transferred to the cooling unit 85 by the transfer arm 87 to be cooled, for example, to 23° C. (step S2), in which case the wafer W may be cooled in accordance with the same profile as the temperature profile shown in FIG. 5. The cooled wafer W is transferred to the coating unit 83 by the transfer arm 87 to be coated with a resist solution, whereby a resist film is formed thereon (step S3).

The wafer W coated with the resist film is heated in the heating unit 84, and subsequently sent to the aligner 89 via the interface unit 88 to be exposed through a mask corresponding to a pattern (step S4).

Thereafter, the wafer W is returned to the heating unit 84 via the interface unit 88 to undergo baking processing while being heated, for example, to 120° C. (step S5). The wafer W is then moved to the cooling unit 85 by the transfer arm 87 to be cooled, for instance, to 23° C. (step S6), in which case the wafer W may be cooled in accordance with the temperature profile shown in FIG. 5. Subsequently, the wafer W is sent to the developing unit 82 by the transfer arm 87 to be developed, whereby a resist mask is formed (step S7). Thereafter, the wafer W is returned into the cassette C on the transfer stage 81.

Figure 11:
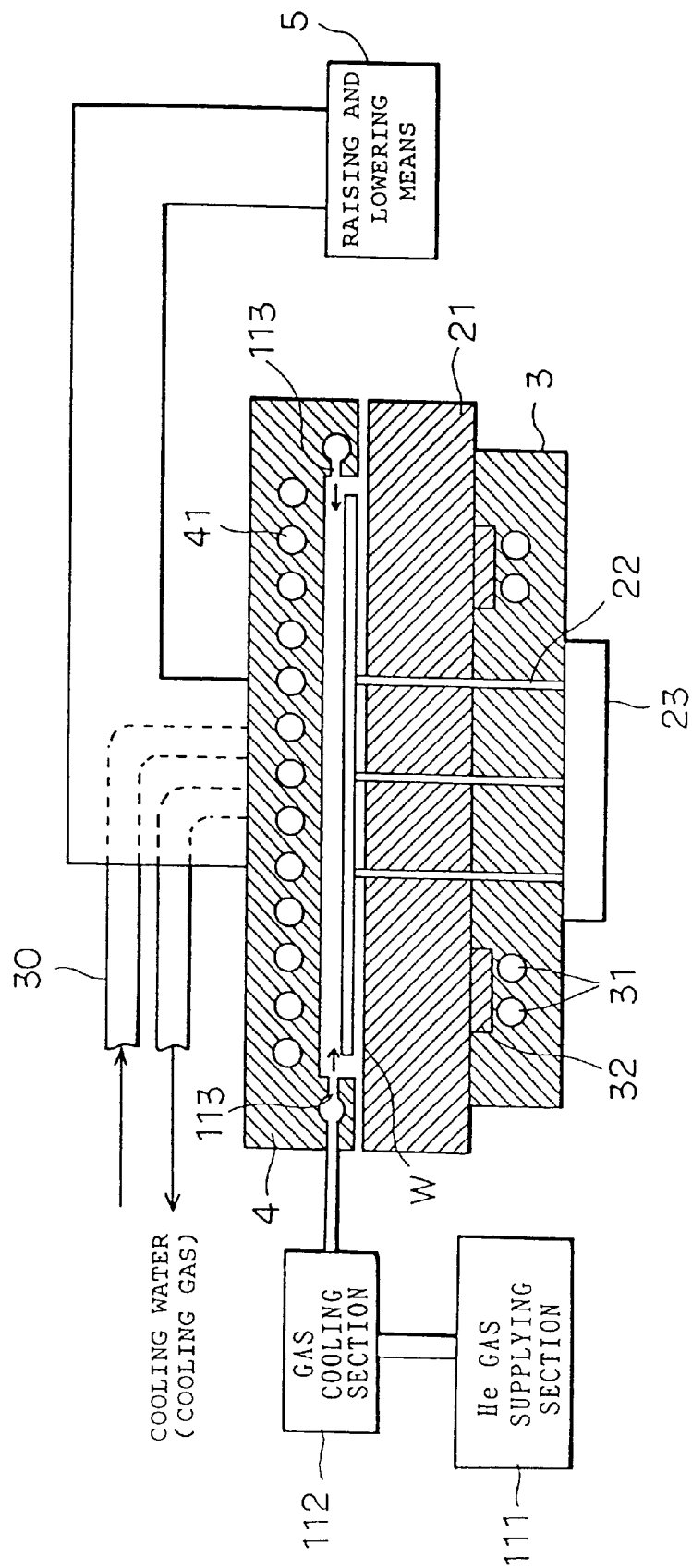
FIG. 11 is a diagrammatic view showing another embodiment of a cooling apparatus according to the present invention.

Next, another embodiment of the present invention will be explained. FIG. 11 is a diagrammatic view showing a cooling apparatus according to this embodiment.

In the cooling apparatus shown in FIG. 11 is provided means for supplying gas with good thermal conductivity, for example, helium (He) gas to a space between the mounting table 21 which is the main temperature controlling plate and the auxiliary cooling plate 4. More specifically, helium gas supplied from a helium gas supplying section 111 is cooled, for example, to 23° C. in a gas cooling section 112, and then supplied to the space between the mounting table 21 and the auxiliary cooling plate 4 through a gas supplying port 113 provided in the auxiliary cooling plate 4.

According to the above configuration, the excellent thermal conductivity of helium gas enables the wafer W disposed between the mounting table 21 and the auxiliary cooling plate 4 to be cooled more rapidly.

If in such a configuration, helium gas cooled to the same temperature as that of the auxiliary cooling plate 4, that is, a temperature lower than 23° C. is supplied first to the space between the mounting table 21 and the auxiliary cooling plate 4, and after a lapse of a predetermined period of time from the above supply, when the auxiliary cooling plate 4 is raised, the helium gas is changed over to helium gas cooled to the same temperature as that of the mounting table 21, for example, 23° C., it becomes possible to cool the wafer W still more rapidly.

If the apparatus is configured so that helium gas is always supplied to the space between the mounting table 21 and the auxiliary cooling plate 4, it is no longer necessary to leave the space between the mounting table 21 and the auxiliary cooling plate 4 closed.

Incidentally, as gas with excellent thermal conductivity, not only helium (He) gas but also other gas such as nitrogen gas can be used.

Figure 12:
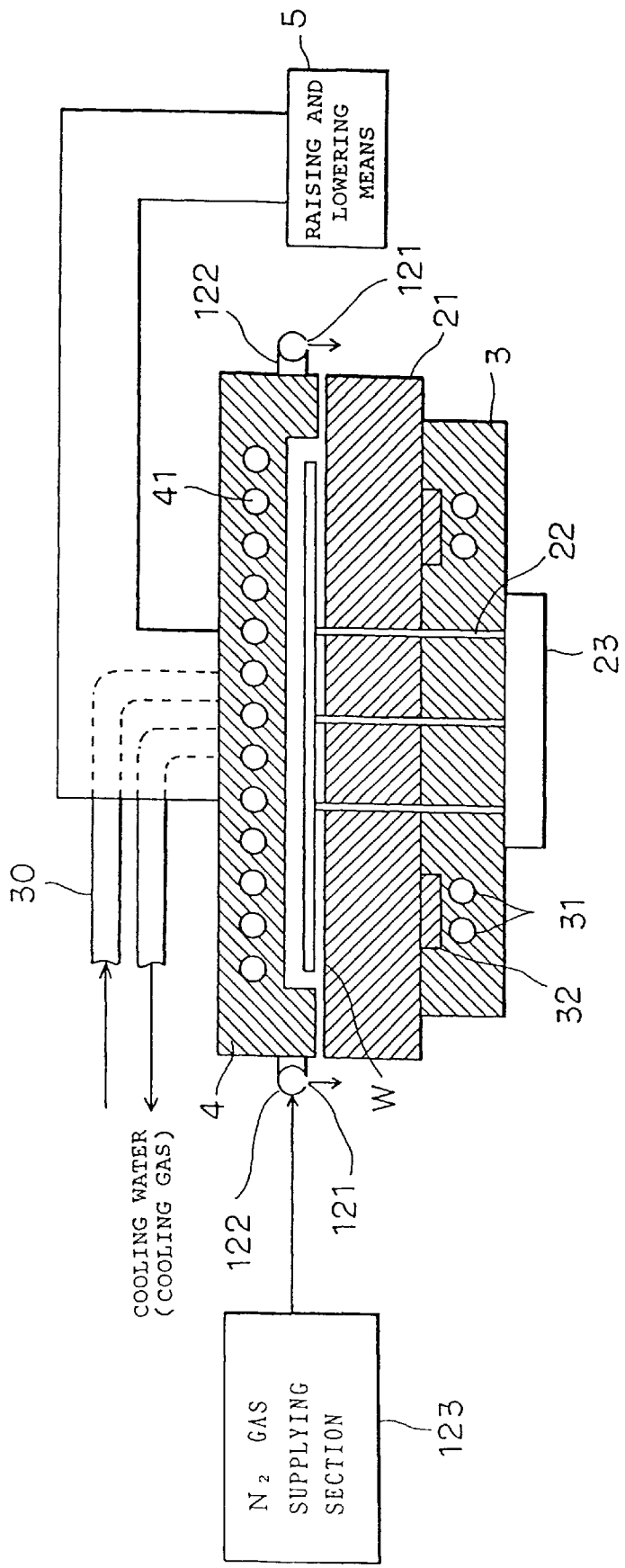
FIG. 12 is a diagrammatic view showing still another embodiment of a cooling apparatus according to the present invention.

Next, still another embodiment of the present invention will be explained. FIG. 12 is a diagrammatic view showing a cooling apparatus according to this embodiment.

Provided in the cooling apparatus shown in FIG. 12 is means for supplying gas, for example, nitrogen gas to the outer periphery of the space between the mounting table 21 as the main temperature controlling plate and the auxiliary cooling plate 4 in such a manner that the gas blocks the outer periphery. More specifically, the cooling apparatus includes a gas supplying body 122 provided with exhaust nozzles 121 such as surround the outer periphery of the space between the mounting table 21 and the auxiliary cooling plate 4. Each exhaust nozzle 121 spouts gas, for example, downward on the outer periphery of the space between the mounting table 21 and the auxiliary cooling plate 4. Nitrogen gas supplied from a nitrogen gas supplying section 123 is spouted from the exhaust nozzles 121, and the outer periphery of the space between the mounting table 21 and the auxiliary cooling plate 4 is blocked by the nitrogen gas.

According to the above configuration, the space between the mounting table 21 and the auxiliary cooling plate 4 is tightly closed by a so-called air curtain made of nitrogen gas, thus enabling more precise control of the cooling temperature of the space between the mounting table 21 and the auxiliary cooling plate 4, that is, the cooling temperature of the wafer W.

In the above explanation, the embodiments in which the present invention is applied to cooling apparatus are given, but the present invention may be applied, for example, to the aforesaid heating unit (the heating unit 84, for example). In this case, a section corresponding to the previously mentioned mounting table 21 is structured as a main heating plate which forms a main temperature controlling plate, and a section corresponding to the auxiliary cooling plate 4 is structured as an auxiliary heating plate which forms an auxiliary temperature controlling plate. The sequence in which the auxiliary heating plate is set at a temperature, for example, higher than that of the main heating plate, and when the temperature of a substrate reaches the set temperature, the auxiliary heating plate is moved away from the substrate can be given, thus obtaining the effect of heating the substrate more rapidly. Incidentally, a substrate to be processed is not limited to a wafer, but a glass substrate for a liquid crystal display is also available.

The aforesaid embodiments have the intention of clarifying technical meaning of the present invention. Therefore, the present invention is not intended to be limited to the above concrete embodiments and to be interpreted in a narrow sense, and various changes may be made therein without departing from the spirit of the present invention and within the meaning of the claims.

What is claimed is:

1. A substrate processing apparatus, comprising:
   a first cooling plate being set at a first temperature and having a first face on which a substrate is mounted;
   a second cooling plate being set at a second temperature and having a second face opposite the first face; and
   means for adjusting a space between the first face and the second face by moving at least either said first cooling plate or said second cooling plate.

2. The apparatus as set forth in claim 1,
   wherein the second temperature is lower than the first temperature.

3. The apparatus as set forth in claim 1,
   wherein the first temperature is approximately 23° C.

4. The apparatus as set forth in claim 1, further comprising:
   a holding member, provided to freely protrude from or retract into the first face, protruding from the first face to hold the substrate.

5. The apparatus as set forth in claim 1,
   wherein said space adjusting means adjusts the space between the first face and the second face by moving said second cooling plate.

6. The apparatus as set forth in claim 2,
   wherein said space adjusting means enlarges the space between the first face and the second face before a temperature of the substrate becomes lower than the first temperature.

7. The apparatus as set forth in claim 6,
   wherein said space adjusting means enlarges the space between the first face and the second face stepwise.

8. The apparatus as set forth in claim 6,
   wherein said space adjusting means enlarges the space between the first face and the second face while varying velocity at which the space is enlarged.

9. The apparatus as set forth in claim 6, further comprising:
   means for detecting the temperature of the substrate mounted on the first face,
   said space adjusting means enlarging the space between the first face and the second face before the temperature of the substrate becomes lower than the first temperature, based on the detected temperature.

10. The apparatus as set forth in claim 6, further comprising:
    means for measuring a mounting period of time of the substrate mounted on the first face,
    said space adjusting means enlarging the space between the first face and the second face before the temperature of the substrate becomes lower than the first temperature, base on the measured mounting period of time.

11. The apparatus as set forth in claim 1,
    wherein the second face is black.

12. The apparatus as set forth in claim 1,
    wherein protruding portions and recessed portions are formed in the second face.

13. The apparatus as set forth in claim 1, further comprising:
    means for supplying gas with good thermal conductivity to the space between the first face and the second face.

14. The apparatus as set forth in claim 13,
    wherein the gas with good thermal conductivity is helium gas.

15. The apparatus as set forth in claim 13,
    wherein the gas with good thermal conductivity is cooled.

16. The apparatus as set forth in claim 13,
    wherein said gas supplying means supplies the gas cooled approximately to the second temperature to the space, and after a lapse of a predetermined period of time from the supply, supplies the gas cooled approximately to the first temperature to the space.

17. The apparatus as set forth in claim 13,
    wherein said gas supplying means always supplies the gas to the space.

18. The apparatus as set forth in claim 13,
    wherein the first face of said first cooling plate includes a proximity pin for holding the substrate while lifting it off the first face.

19. The apparatus as set forth in claim 13, further comprising:
    means for varying the second temperature.

20. The apparatus as set forth in claim 1, further comprising:

means for supplying gas to an outer periphery of the space between the first face and the second face in such a manner that the gas blocks the outer periphery.

21. A substrate processing apparatus, comprising:

a first heating plate being set at a first temperature and having a first face on which a substrate is mounted;

a second heating plate being set at a second temperature and having a second face opposite the first face; and means for adjusting a space between the first face and the second face by moving at least either said first heating plate or said second heating plate.

22. The apparatus as set forth in claim 21, wherein the second temperature is higher than the first temperature.

23. A substrate processing method, comprising the steps of:

(a) mounting a substrate on a main temperature controlling plate;

(b) moving an auxiliary temperature controlling plate, which is set at a temperature different from that of the main temperature controlling plate, close to the substrate from the opposite side to the main temperature controlling plate; and (c) moving the auxiliary temperature controlling plate away from the substrate when the temperature of the substrate reaches a predetermined temperature range.

24. The method as set forth in claim 23, wherein in said step (a), the substrate is mounted on the main temperature controlling plate while being lifted off the same plate.

25. The method as set forth in claim 23, further comprising:

a step of measuring the temperature of the substrate, wherein in said step (c), the auxiliary temperature controlling plate is moved away from the substrate based on the measured temperature.

26. The method as set forth in claim 23, wherein in said step (c), after a predetermined time lapse from when the auxiliary temperature controlling plate is moved closed to the substrate, the auxiliary temperature controlling plate is moved away from the substrate.

* * * * *